(12) United States Patent
Chen et al.

(10) Patent No.: US 7,638,371 B2
(45) Date of Patent: Dec. 29, 2009

(54) METHOD FOR MANUFACTURING THIN FILM TRANSISTOR DISPLAY ARRAY WITH DUAL-LAYER METAL LINE

(75) Inventors: Yu-Cheng Chen, Hsinchu (TW); Hung-Tse Chen, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 270 days.

(21) Appl. No.: 11/369,624

(22) Filed: Mar. 7, 2006

(65) Prior Publication Data

US 2007/0212824 A1    Sep. 13, 2007

(51) Int. Cl.
*H01L 21/00*    (2006.01)

(52) U.S. Cl. .............................. 438/149; 257/E21.094; 257/E21.104; 257/E21.121; 257/227; 257/443; 438/128; 438/618

(58) Field of Classification Search .......... 257/E21.104, 257/E21.094, E21.411–E21.416, 291, 227, 257/223, 443, 655, 292, 439; 438/128, 142, 438/618
See application file for complete search history.

(56) References Cited

U.S. PATENT DOCUMENTS

| | | | |
|---|---|---|---|
| 4,938,567 A | 7/1990 | Chartier | |
| 6,642,979 B2 * | 11/2003 | Choo et al. | 349/113 |
| 2003/0148561 A1 * | 8/2003 | Nakajima | 438/151 |
| 2005/0073619 A1 * | 4/2005 | Chen et al. | 349/43 |
| 2005/0253249 A1 | 11/2005 | Chen et al. | |

* cited by examiner

*Primary Examiner*—W. David Coleman
*Assistant Examiner*—Su C Kim
(74) *Attorney, Agent, or Firm*—Alston & Bird LLP

(57) ABSTRACT

A method for manufacturing a thin film transistor ("TFT") array includes providing a substrate, a patterned first metal layer on the substrate including a plurality of first conductive lines and a plurality of second conductive lines disposed orthogonal to the first conductive lines, an insulating layer over the patterned first metal layer, a patterned silicon layer, a patterned passivation layer over the patterned silicon layer, and a patterned doped silicon layer and a patterned second metal layer over the patterned passivation layer, filling exposed portions of the patterned silicon layer and exposed portions of the first conductive lines and the second conductive lines, where the patterned second metal layer includes a plurality of third conductive lines and a plurality of fourth conductive lines, each of which corresponding respectively to one of the plurality of first conductive lines and the plurality of second conductive lines.

30 Claims, 13 Drawing Sheets

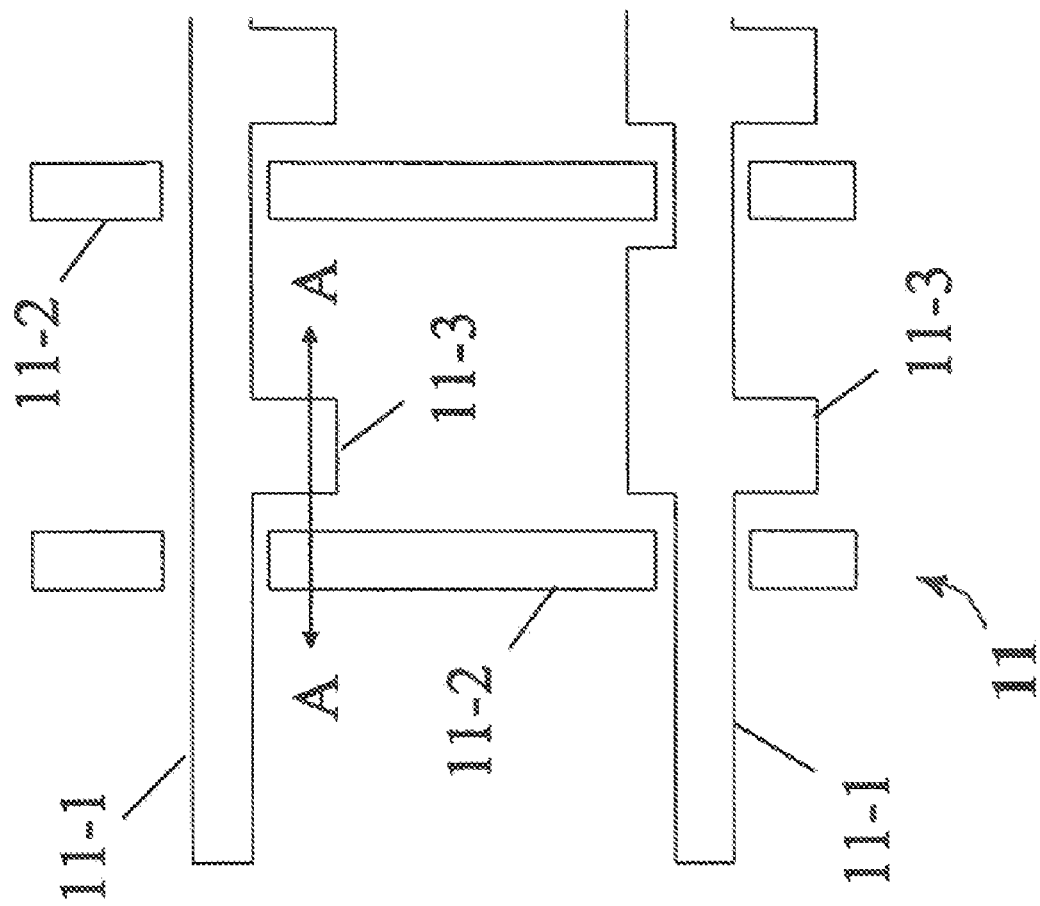
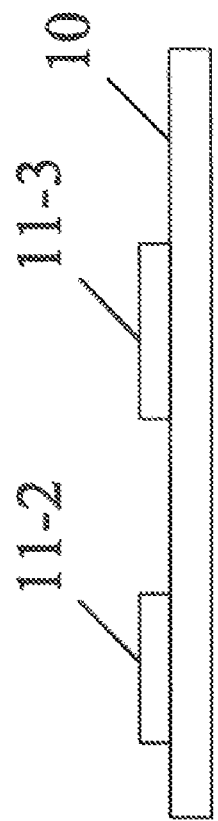
FIG. 1B
FIG. 1A

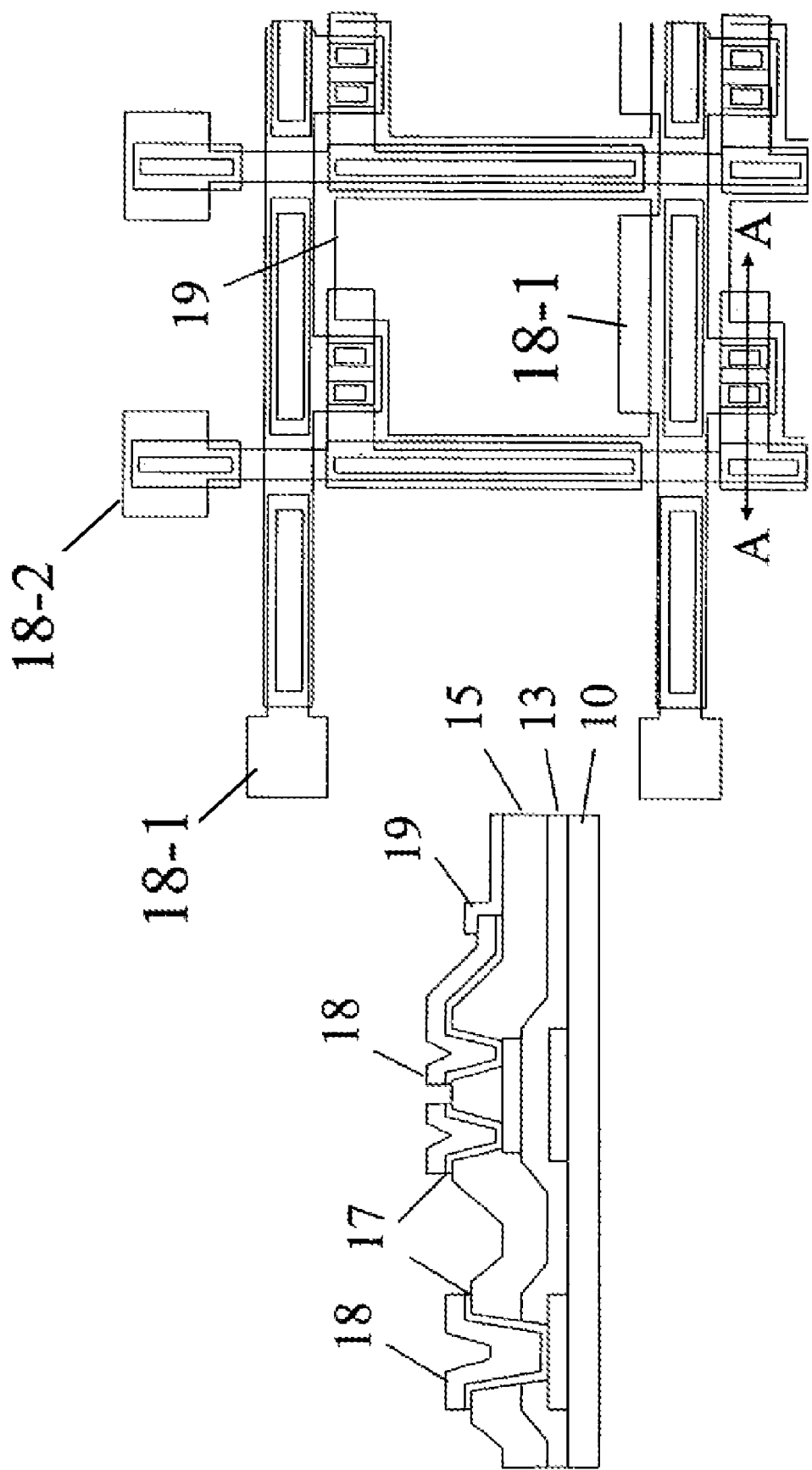

METHOD FOR MANUFACTURING THIN FILM TRANSISTOR DISPLAY ARRAY WITH DUAL-LAYER METAL LINE

CROSS REFERENCE TO RELATED APPLICATIONS

This application is related to U.S. patent application Ser. No. 10/687,759, filed Oct. 20, 2003 and U.S. patent application Ser. No. 11/131,084, filed May 17, 2005, each of which being incorporated herein by reference in their entirety.

BACKGROUND OF THE INVENTION

The present invention relates generally to thin film transistors ("TFTs"), and more particularly, to a method for manufacturing TFT arrays.

With the progress in semiconductor manufacturing techniques, the panel size of flat panel display devices such as liquid crystal display ("LCD") devices has been increasing rapidly. As a result, the conductive lines in a flat panel device have gained a considerable increase in length, adversely resulting in an undesirable resistor-capacitor ("RC") delay. Such an RC delay may severely impact the performance of the flat panel device. For LCD TVs having a 37-inch or greater panel size, the RC delay within the scan lines has been found to adversely affect the display quality. One of conventional methods to address the RC delay issue proposes a two-sided driving scheme, wherein both sides of a panel are provided with drivers in order to offset or alleviate the RC delay. However, this method requires additional driving integrated circuits ("ICs"), and in turn the additional cost for packaging these ICs. Consequently, it is desirable to have a method for manufacturing TFT arrays that is able to reduce RC delay in the conductive lines in the TFT arrays without compromising the driving scheme.

BRIEF SUMMARY OF THE INVENTION

The present invention is directed to a method for manufacturing thin film transistor ("TFT") arrays including dual-layer conductive lines that obviate one or more problems resulting from the limitations and disadvantages of the prior art.

In accordance with an embodiment of the present invention, there is provided a method for manufacturing a thin film transistor ("TFT") array that comprises providing a substrate, forming a patterned first metal layer on the substrate, the patterned first metal layer including a plurality of first conductive lines and a plurality of second conductive lines disposed orthogonal to the first conductive lines, each of the first conductive lines including a plurality of gate electrodes, each of the gate electrodes being disposed near an intersection of one of the first conductive lines and one of the second conductive lines, forming an insulating layer over the patterned first metal layer, forming a patterned silicon layer, forming a patterned passivation layer over the patterned silicon layer and the patterned first metal layer, exposing portions of the patterned silicon layer and a portion of each one of the first conductive lines and each one of the second conductive lines, and forming a patterned doped silicon layer and a patterned second metal layer over the patterned passivation layer, filling the exposed portions of the patterned silicon layer and the exposed portions of the first conductive lines and the second conductive lines, the patterned second metal layer including a plurality of third conductive lines and a plurality of fourth conductive lines, each of which corresponding respectively to one of the plurality of first conductive lines and one of the plurality of second conductive lines.

Also in accordance with the present invention, there is provided a method for manufacturing a thin film transistor ("TFT") array that comprises providing a substrate, forming a patterned first metal layer on the substrate, the patterned first metal layer including a plurality of first conductive lines and a plurality of second conductive lines disposed orthogonal to the first conductive lines, each of the first conductive lines including a plurality of gate electrodes, each of the gate electrodes being disposed near an intersection of one of the first conductive lines and one of the second conductive lines, forming an insulating layer over the patterned first metal layer, forming a patterned silicon layer, forming a patterned passivation layer over the patterned silicon layer and the patterned first metal layer, exposing portions of the patterned silicon layer and portions of each of the first conductive lines and the second conductive lines, doping impurity into the exposed portions of the patterned silicon layer, and forming a patterned second metal layer over the patterned passivation layer, filling the exposed portions of patterned silicon layer and the exposed portions of the first conductive lines or second conductive lines, the patterned second metal layer including a plurality of third conductive lines and a plurality of fourth conductive lines, each of which corresponds respectively to one of the plurality of first conductive lines and one of the plurality of second conductive lines of the patterned first metal layer.

Further in accordance with the present invention, there is provided a method for manufacturing a thin film transistor ("TFT") array that comprises providing a substrate, forming a patterned first metal layer on the substrate, the patterned first metal layer including a plurality of first conductive lines and a plurality of second conductive lines disposed orthogonal to the first conductive lines, each of the second conductive lines including a plurality of branch lines separated from each other, forming an insulating layer over the patterned first metal layer, forming a patterned silicon layer over the insulating layer, exposing portions of each of the first conductive lines and the branch lines of each of the second conductive lines of the patterned first metal layer, forming a patterned second metal layer over the patterned silicon layer, filling the exposed portions of each of the first conductive lines and the exposed branch lines of each of the second conductive lines, the patterned second metal layer including a plurality of third conductive lines and a plurality of fourth conductive lines, each of which corresponding respectively to one of the plurality of first conductive lines and one of the plurality of second conductive lines of the patterned first metal layer.

Additional features and advantages of the present invention will be set forth in portion in the description which follows, and in portion will be obvious from the description, or may be learned by practice of the invention. The features and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

In the drawings:

FIGS. 1A to 1J are diagrams illustrating a method for manufacturing a thin film transistor ("TFT") array in accordance with a first embodiment of the present invention;

DETAILED DESCRIPTION OF THE INVENTION

Reference will now be made in detail to the present embodiments of the invention, examples of which are illustrated in the accompanying drawings. Wherever possible, the same reference numbers will be used throughout the drawings to refer to the same or like portions.

Figures 1C, 1D:
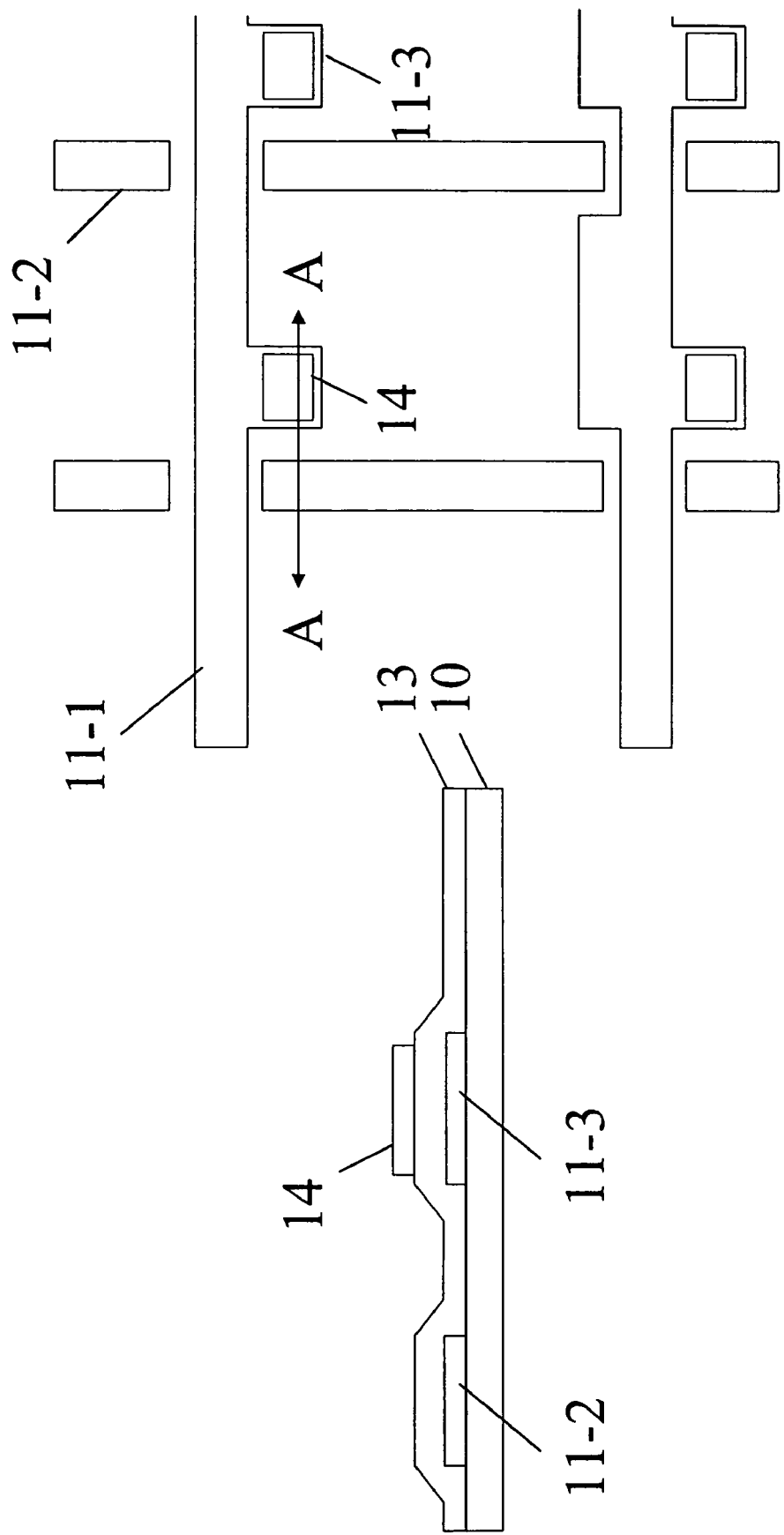

FIGS. 1A to 1J are diagrams illustrating a method for manufacturing a thin film transistor ("TFT") array in accordance with a first embodiment of the present invention. FIG. 1A is a cross-sectional view along the direction AA of a top view illustrated in FIG. 1B. Referring to FIG. 1A, a substrate 10, made of glass or resin, for example, is provided. Preferably the thickness of the substrate 10 ranges from approximately 0.3 to 0.7 mm (millimeter) but could be thinner or thicker. Next, a patterned first metal layer 11 is formed on the substrate 10 by forming a layer of first metal on the substrate 10 by, for example, a conventional physical vapor deposition ("PVD"), sputtering or some other suitable process, followed by a conventional patterning and etching process, using a first mask. Referring to FIG. 1B, the patterned first metal layer 11 includes a plurality of first conductive lines 11-1 substantially in parallel with each other, and a plurality of second conductive lines 11-2 substantially orthogonal to the first conductive lines 11-1. Each of the first conductive lines 11-1 includes gate electrodes 11-3. Each of the gate electrodes 11-3 is disposed near an intersection of one of the first conductive lines 11-1 and one of the second conductive lines 11-2. Suitable materials for the first metal layer include but are not limited to TiAlTi, MoAlMo, CrAlCr, MoW, Cr and Cu. Preferably, the thickness of gate electrodes 11-1 ranges from approximately 1000 to 2000 Å (angstrom) but could be some other thickness. Each of the first conductive lines 11-1 eventually becomes a main line of a dual-layer wire, and each of the second conductive lines 11-2 eventually becomes branch lines of a dual-layer wire. A dual-layer or multi-layer wire structure has been disclosed in U.S. patent application Ser. No. 10/687,759, filed Oct. 20, 2003 and U.S. patent application Ser. No. 11/131,084, filed May 17, 2005, which are herein incorporated by reference.

Referring to FIGS. 1C and 1D, an insulation layer 13 is formed on the patterned first metal layer 11 by, for example, a conventional chemical vapor deposition ("CVD") process or some other suitable process. Suitable materials for the insulation layer 13 include silicon nitride, silicon oxide and silicon oxynitride. Preferably, the thickness of the insulation layer 13 ranges from approximately 2500 to 4000 Å. Next, a patterned silicon layer 14 is formed on the insulation layer 13 by forming a layer of silicon by, for example, a conventional CVD or some other suitable process, followed by a conventional patterning and etching process, using a second mask. The patterned silicon layer 14 defines an active region disposed over each of the gate electrodes 11-1. The patterned silicon layer 14 comprises an amorphous silicon layer or a polycrystalline silicon layer. Preferably, the thickness of the patterned silicon layer 14 ranges from approximately 500 to 3000 Å but could be other thickness.

Figures 1E, 1F:
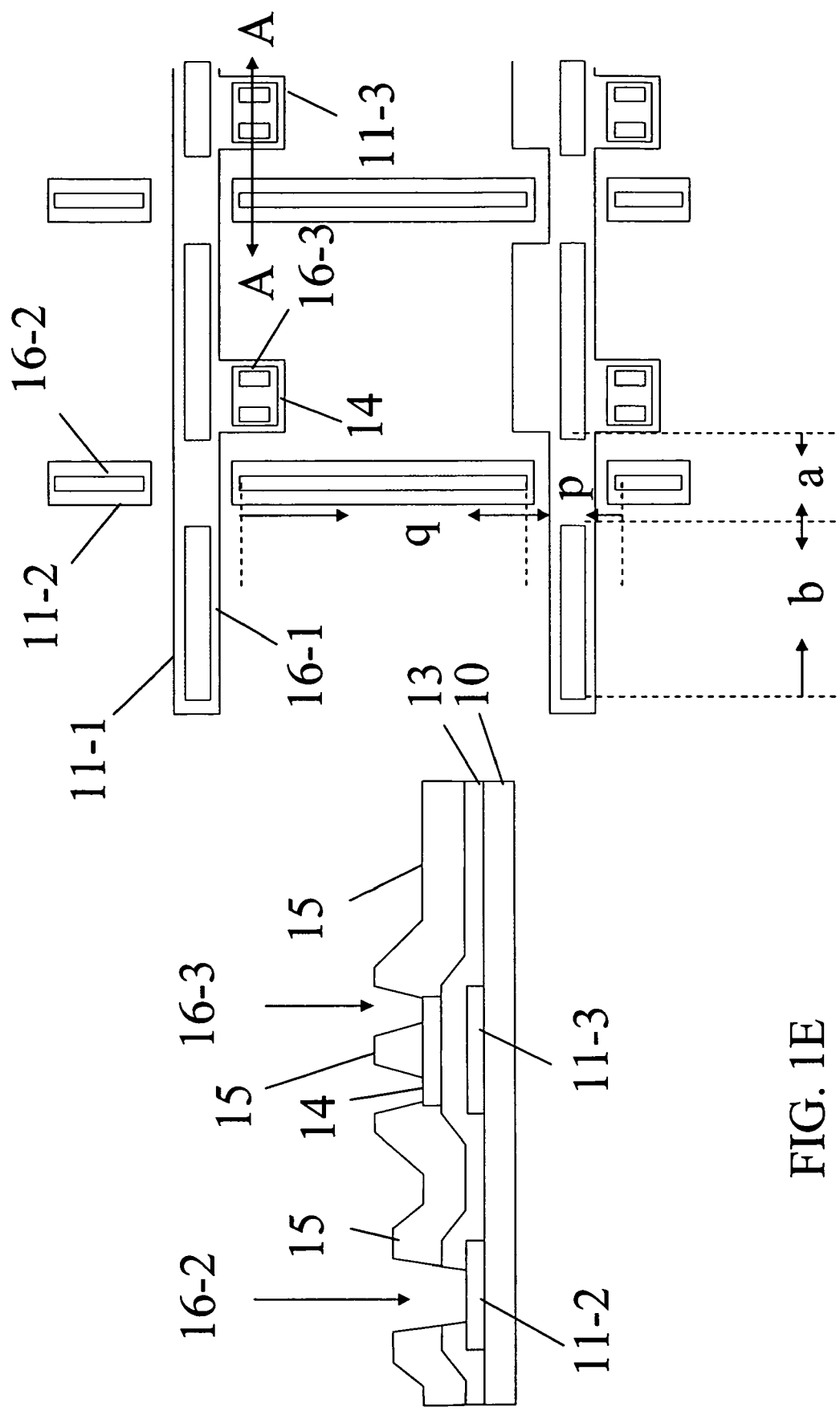

Referring to FIGS. 1E and 1F, a patterned passivation layer 15 is formed over the insulation layer 13 and the patterned silicon layer 14 by forming a layer of insulating material such as oxide or nitride by, for example, a conventional CVD process or other suitable process followed by a conventional patterning and etching process, using a third mask. The patterned passivation layer 15 exposes the first conductive lines 11-1, the second conductive lines 11-2 and the patterned silicon layer 14 through trenches 16-1, 16-2 and 16-3, respectively. Each of the active regions is formed with a pair of trenches 16-3, which define a source region and a drain region for a corresponding TFT transistor Preferably, the thickness of the patterned passivation layer 15 ranges from approximately 3000 to 5000 Å.

Each of the trenches 16-1 disposed over one of the first conductive lines 11-1 is separated from an adjacent trench 16-1 disposed over the same one conductive line by a distance denoted as "a". In the first embodiment, the ratio of a length "b" of a trench to the distance "a" ranges from approximately 2 to 20. Likewise, each of the trenches 16-2 disposed over one of the second conductive lines 11-2 is separated from an adjacent trench 16-2 disposed over the same one second conductive line 16-2 by a distance denoted as "p". In the first embodiment, the ratio of a length "q" of the trench 16-2 to the distance "p" ranges from approximately 2 to 20.

Figures 1G, 1H:
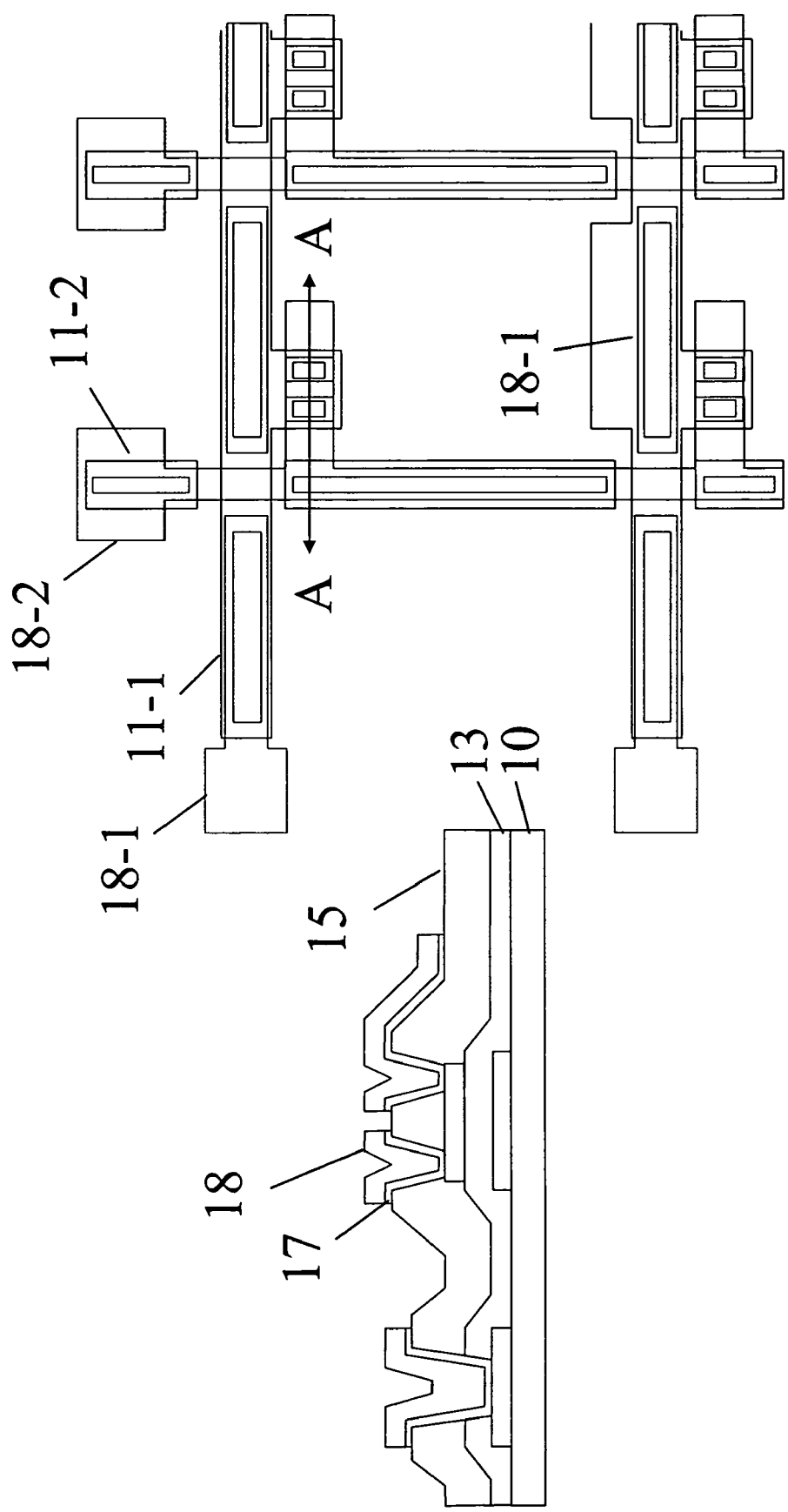

Referring to FIGS. 1G and 1H, a patterned doped silicon layer 17 and a patterned second metal layer 18 are formed over the patterned passivation layer 15, filling the trenches 16-1, 16-2 and 16-3. The patterned silicon layer 17 and patterned second metal layer 18 are formed by forming a layer of heavily-doped n-type (n+) silicon by, for example, a conventional CVD process and then forming a layer of second metal on the n+ silicon layer by, for example, a conventional PVD process, followed by a conventional patterning and etching process, using a fourth mask. Suitable materials for the second metal layer include but are not limited to TiAlTi, MoAlMo, CrAlCr, MoW, Cr and Cu. Preferably, the thickness of the patterned doped silicon layer 17 is approximately 500 Å but could be other thicker or thinner. Preferably, the thickness of the patterned second metal layer 18 ranges from approximately 1000 to 3000 Å.

The patterned second metal layer 18 includes a plurality of third conductive lines 18-1 and a plurality of fourth conductive lines 18-2 orthogonal to the third conductive lines 18-1. Each of the third conductive lines 18-1 eventually becomes a branch line of a dual-layer wire, and each of the fourth conductive lines 18-2 eventually becomes a main line of a dual-layer wire. The third conductive lines 18-1 of the patterned second metal layer 18 are electrically connected to the first conductive lines 11-1 of the patterned first metal layer 11 through the trenches 16-1 to form a dual-layer wire, i.e., a dual-layer scan line for the TFT array. The fourth conductive lines 18-2 of the patterned second metal layer 18 are electrically connected to the second conductive lines 11-2 of the patterned first metal layer 11 through the trenches 16-2 to form a dual-layer wire, i.e., a dual-layer data line for the TFT array. The ratio of the length of a branch line corresponding to a main line to the distance between the branch line and an immediately adjacent branch line corresponding to the same main line ranges from approximately 2 to 20.

Referring to FIGS. 1I and 1J, a patterned pixel electrode layer 19 is formed by forming a layer of conductive material, for example, indium tin oxide ("ITO") over the patterned second metal layer 18 and the patterned passivation layer 15 by a conventional PVD process followed by a conventional patterning and etching process, using a fifth mask. The patterned pixel electrode layer 19 serves as pixel electrodes for the TFT array. Preferably, the thickness of the patterned conductive layer ranges from approximately 500 to 1000 Å.

Figure 2:
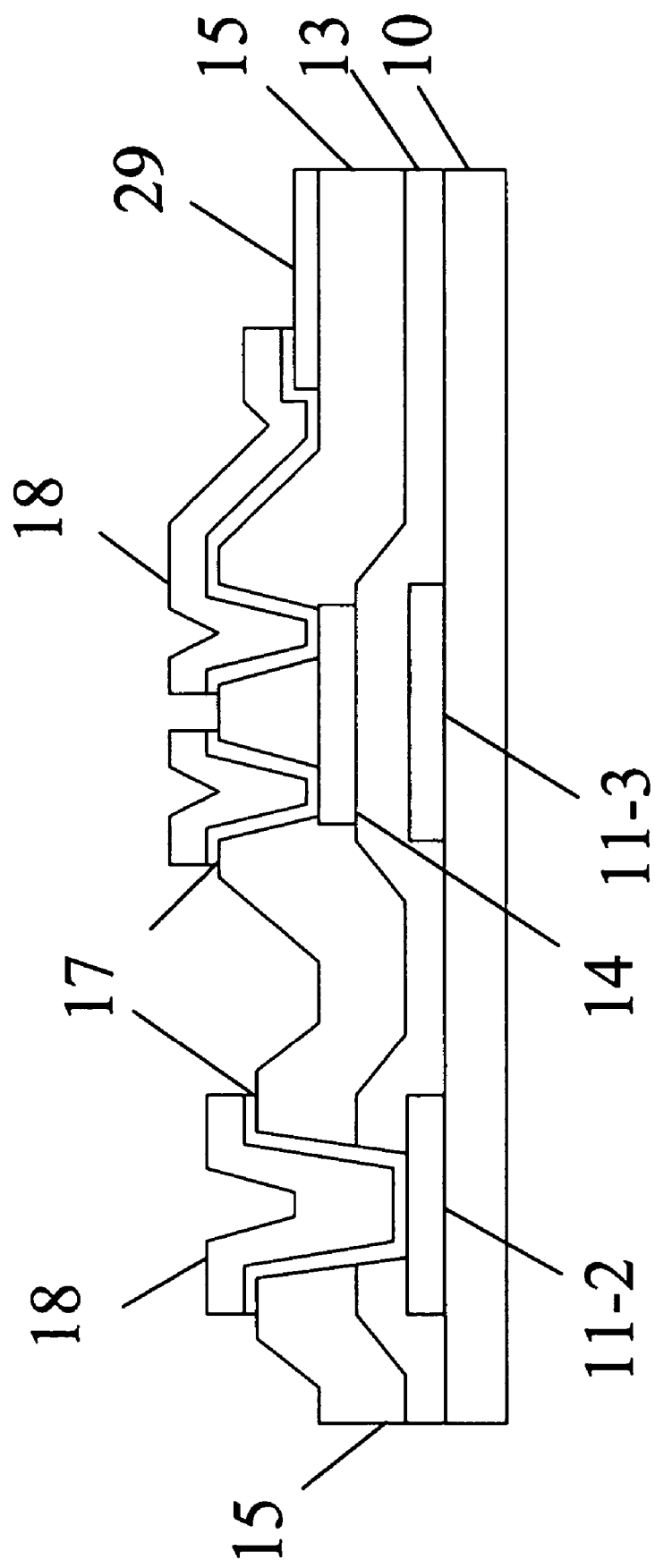
FIG. 2 is a cross-sectional diagram illustrating a method for manufacturing a TFT array in accordance with a second embodiment of the present invention.

FIG. 2 is a cross-sectional diagram illustrating a method for manufacturing a TFT array in accordance with a second embodiment of the present invention. Referring to FIG. 2, also referring to FIGS. 1A to 1E, a first mask is used to define the patterned first metal layer 11. Next, a layer of insulating material 13 is formed over the patterned first metal layer 11. A second mask is used to define the patterned silicon layer 14. A passivation layer 15 is formed over the patterned silicon layer 14 and insulating material 13. A patterned pixel electrode layer 29 such as an ITO layer is formed on the passivation layer by a conventional PVD process followed by a conventional patterning and etching process, using a third mask. Then, the passivation layer 15 is patterned by performing a conventional patterning and etching process, using a forth mask, exposing portions of the patterned silicon layer 14 and portions of the patterned first metal layer 11-1 and 11-2. Subsequently, the patterned n+ silicon layer 17 and the patterned second metal layer 18 are formed over the patterned pixel electrode layer 29 and the patterned passivation layer 15, using a fifth mask.

Alternatively, referring to FIG. 2 and also FIGS. 1A to 1E, first, second and third masks may be used to define the patterned first metal layer 11, the patterned silicon layer 14 and the patterned passivation layer 25, respectively. A patterned pixel electrode layer 29 is formed over the patterned passivation layer 25 by forming a layer of conductive material such as ITO by a conventional PVD process followed by a conventional patterning and etching process, using a fourth mask. Subsequently, the patterned n+ silicon layer 17 and the patterned second metal layer 18 are formed over the patterned pixel electrode layer 29 and the patterned passivation layer 25, using a fifth mask.

Figure 3:
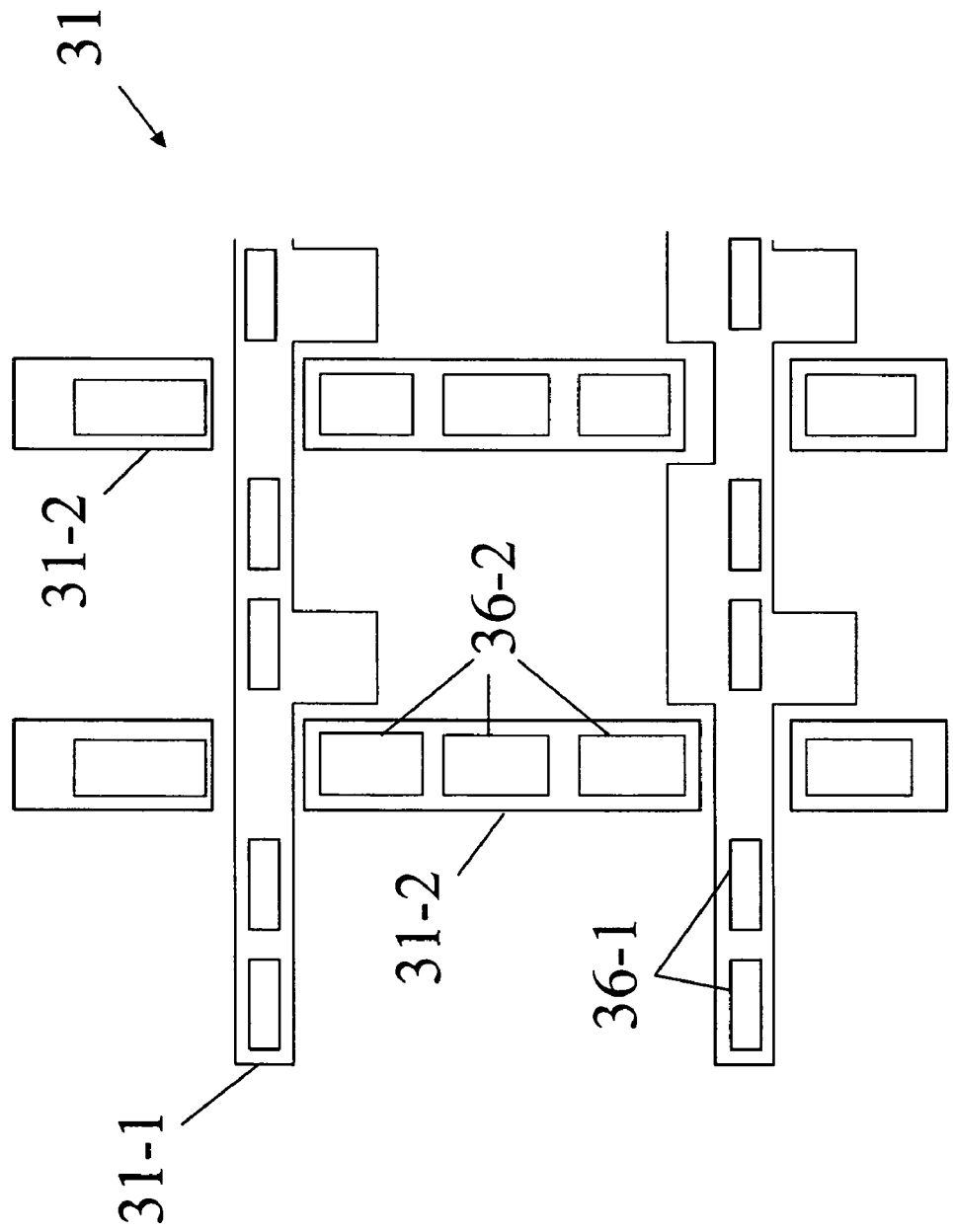
FIG. 3 is a schematic diagram illustrating a method for manufacturing a TFT array in accordance with a third embodiment of the present invention.

FIG. 3 is a schematic diagram illustrating a method for manufacturing a TFT array in accordance with a third embodiment of the present invention. Referring to FIG. 3, a patterned first metal layer 31 includes a plurality of first conductive lines 31-1 and a plurality of second conductive lines 31-2. Instead of a single, continuous trench such as the trench 16-2 illustrated in FIG. 1F, a plurality of contact holes 36-2 are formed in each of the second conductive lines 31-2 between two adjacent first conductive lines 31-1. Likewise, a plurality of contact holes 36-1 may be formed in each of the first conductive lines 31-1 between two adjacent second conductive lines 31-2.

Figures 4A, 4B:
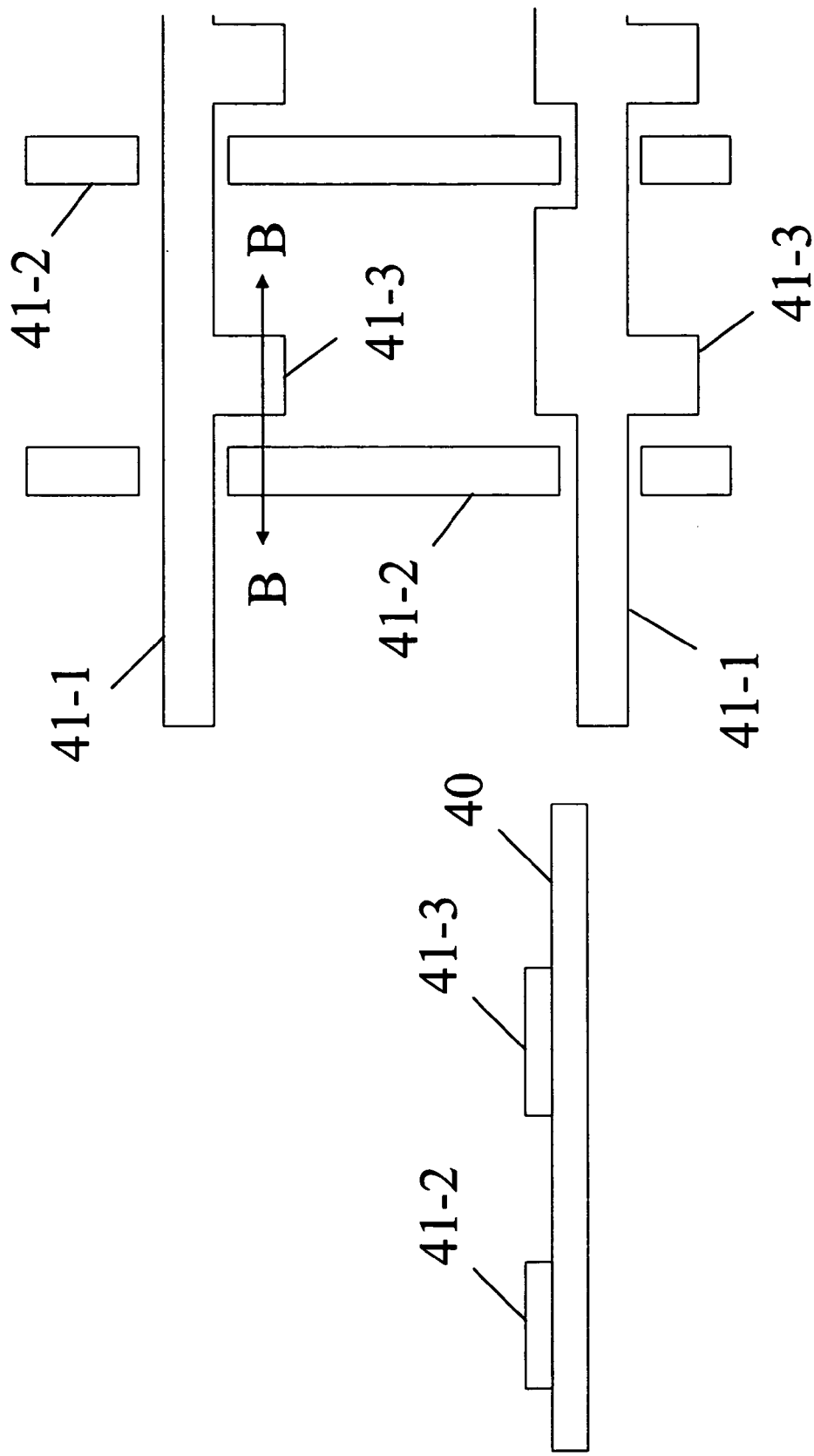
FIGS. 4A to 4J are diagrams illustrating a method for manufacturing a TFT array in accordance with a fourth embodiment of the present invention.

FIGS. 4A to 4J are diagrams illustrating a method for manufacturing a thin film transistor ("TFT") array in accordance with a fourth embodiment of the present invention. FIG. 4A is a cross-sectional view along the direction BB of a top view illustrated in FIG. 4B. Referring to FIG. 4A, a substrate 40, made of glass or resin, for example, is provided. A patterned first metal layer 41 is formed on the substrate 40 by forming a layer of metal on the substrate 40 by a conventional PVD process followed by a conventional patterning and etching process, using a first mask. The patterned first metal layer 41 includes a plurality of first conductive lines 41-1 substantially in parallel with each other, and a plurality of second conductive lines 41-2 substantially orthogonal to the first conductive lines 41-1. Each of the first conductive lines 41-1 includes gate electrodes 41-3. Each of the gate electrodes 41-3 is disposed near an intersection of one of the first conductive lines 41-1 and one of the second conductive lines 41-2. Each of the first conductive lines 41-1 eventually becomes a main line of a dual-layer wire, and each of the second conductive lines 41-2 eventually becomes branch lines of a dual-layer wire.

Figures 4C, 4D:
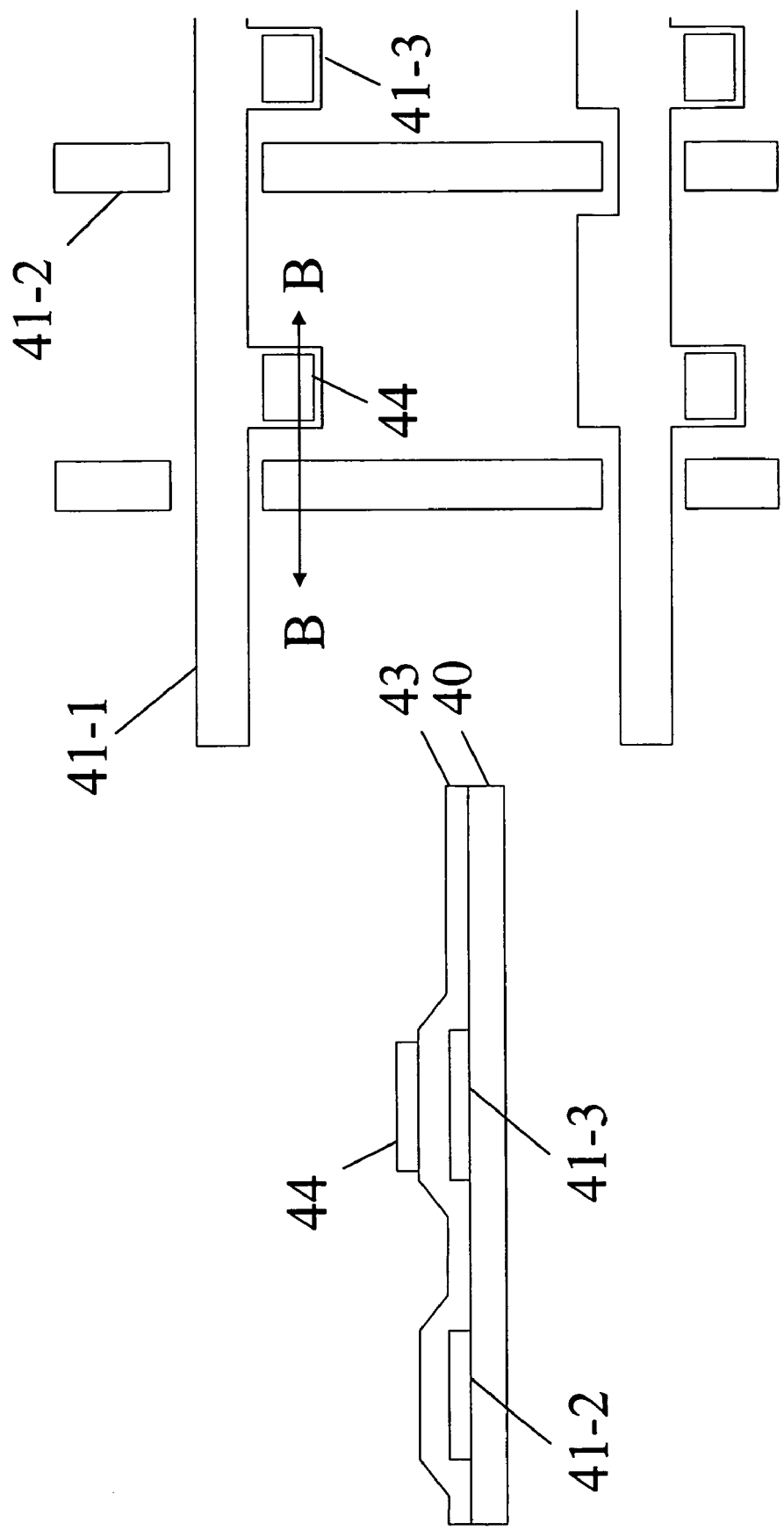

Referring to FIGS. 4C and 4D, an insulation layer 43 is formed on the patterned first metal layer 41 by a conventional CVD process or some other suitable process. Next, a patterned silicon layer 44 is formed on the insulation layer 43 by forming a layer of silicon by, for example, a conventional CVD, laser annealing or some other suitable process, followed by a conventional patterning and etching process, using a second mask, which defines an active region disposed over each of the gate electrodes 41-1. The patterned silicon layer 44 comprises one of an amorphous silicon layer or a polycrystalline silicon layer.

Figures 4E, 4F:
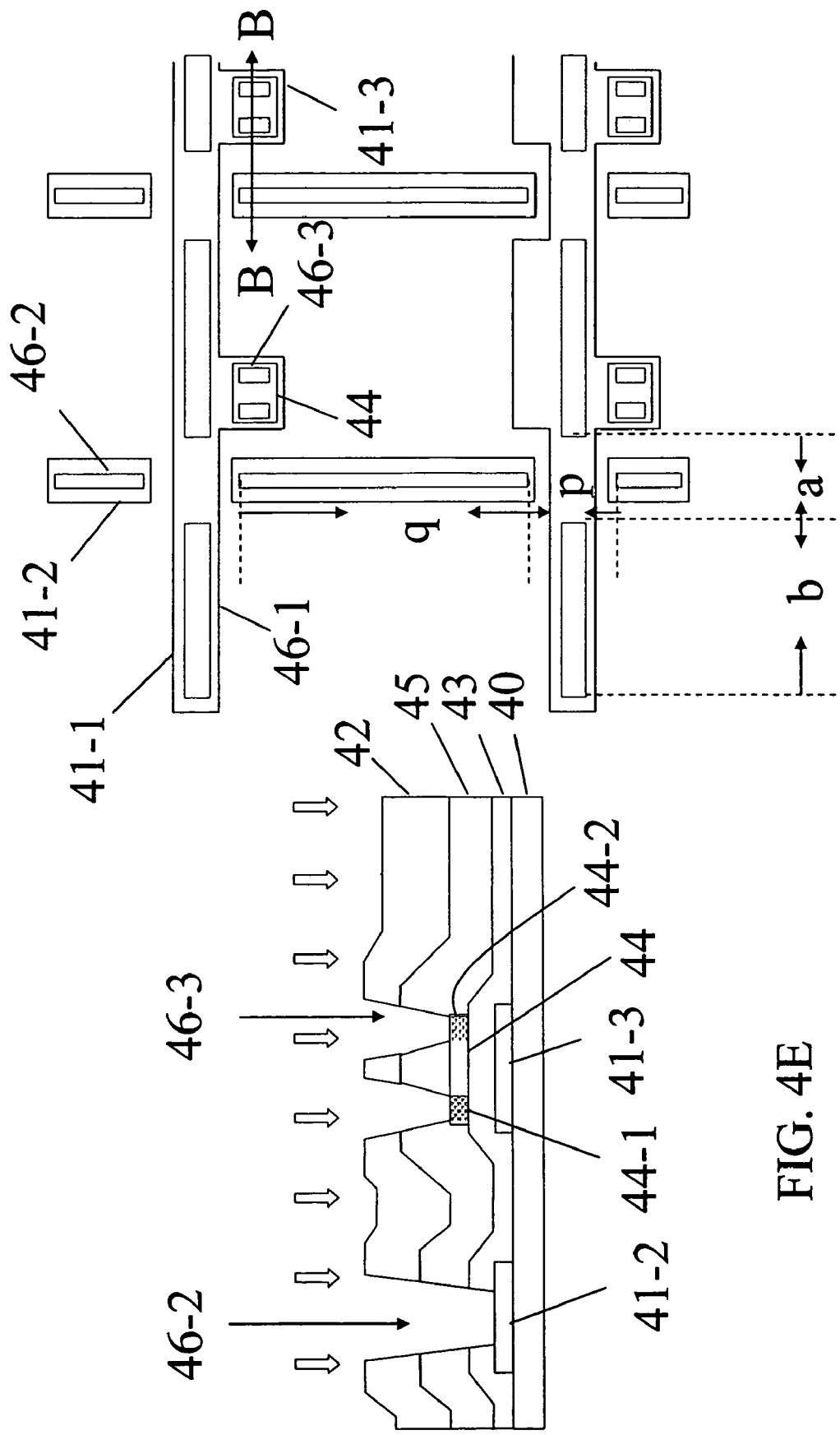

Referring to FIGS. 4E and 4F, a patterned passivation layer 45 is formed over the insulation layer 43 and the patterned silicon layer 44 by forming a layer of insulating material by a conventional CVD process followed by a conventional patterning and etching process, using a third mask and a photoresist layer. The patterned passivation layer 45 exposes the first conductive lines 41-1, second conductive lines 41-2 and the patterned silicon layer 44 through trenches 46-1, 46-2 and 46-3, respectively. The remaining photoresist layer 42 is used as a mask for doping n-type or p-type impurity into the patterned silicon layer 44 by, for example, a conventional implanting process or other suitable process. The photoresist layer defines a first diffused region 44-1 and a second diffused region 44-2, i.e., source and drain or vice versa, for each TFT transistor. The remaining photoresist layer 42 is then stripped off.

Each of the trenches 46-1 disposed over one of the first conductive lines 41-1 is separated from an adjacent trench disposed over the same one conductive line by a distance "a". In the fourth embodiment, the ratio of a length "b" of a trench to the distance "a" ranges from approximately 2 to 20. Likewise, each of the trenches 46-2 disposed over one of the second conductive lines 41-2 is separated from an adjacent trench disposed over the same one conductive line by a distance "p". In the fourth embodiment, the ratio of the length "q" of a trench to the distance "p" ranges from approximately 2 to 20.

Figures 4G, 4H:
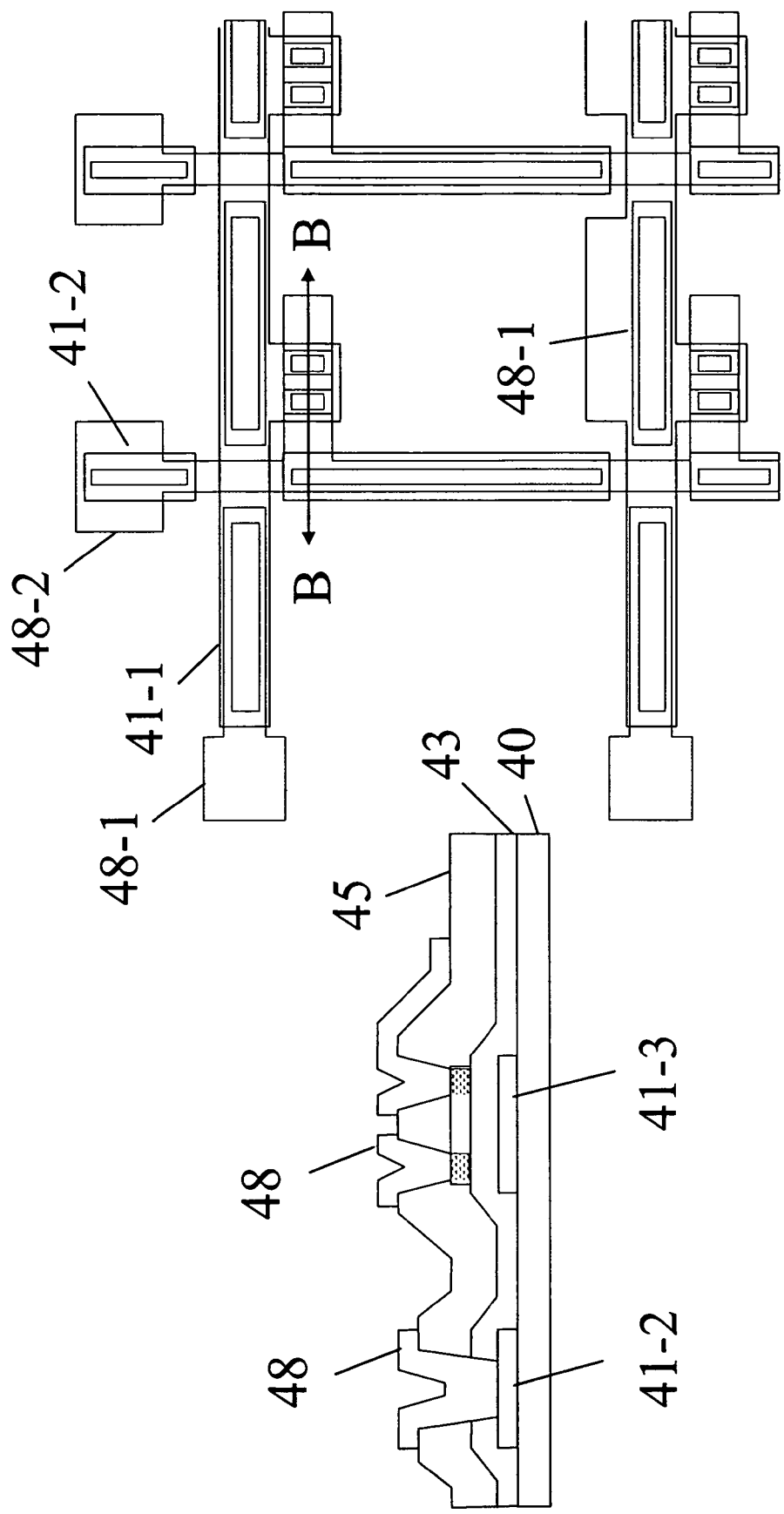

Referring to FIGS. 4G and 4H, a patterned second metal layer 48 is formed over the patterned passivation layer 45, filling the trenches 46-1, 46-2 and 46-3. The second metal layer 48 is formed by forming a layer of metal by a conventional PVD process followed by a conventional patterning and etching process, using a fourth mask.

The patterned second metal layer 48 includes a plurality of third conductive lines 48-1 and a plurality of fourth conductive lines 48-2 orthogonal to the third conductive lines 48-1. Each of the third conductive lines 48-1 eventually becomes branch lines of a dual-layer wire, and each of the fourth conductive lines 48-2 eventually becomes a main line of a dual-layer wire. The third conductive lines 48-1 of the patterned second metal layer 48 are electrically connected to the first conductive lines 41-1 of the patterned first metal layer 11 through the trenches 46-1 to form a dual-layer wire, i.e., a dual-layer scan line for the TFT array. The fourth conductive lines 48-2 of the patterned second metal layer 48 are electrically connected to the second conductive lines 41-2 of the patterned first metal layer 41 through the trenches 46-2 to form a dual-layer wire, i.e., a dual-layer data line for the TFT array. The ratio of the length of a branch line corresponding to a main line to the distance between the branch line and an immediately adjacent branch line corresponding to the same main line ranges from approximately 2 to 20.

Figures 4I, 4J:
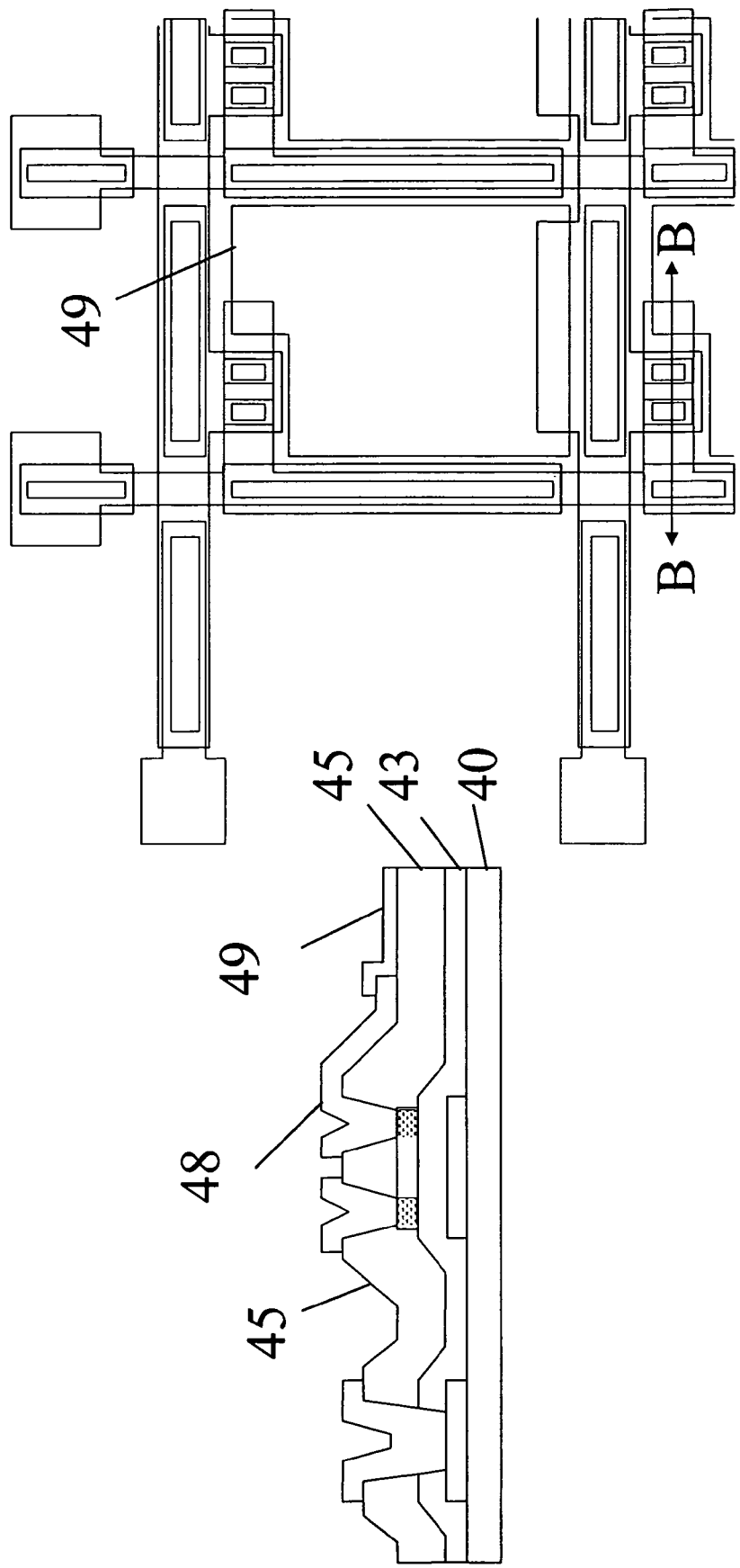

Referring to FIGS. 4I and 4J, a patterned pixel electrode layer 49 is formed by forming a layer of conductive material such as ITO over the patterned second metal layer 48 and patterned passivation layer 45 by a conventional PVD process followed by a conventional patterning and etching process, using a fifth mask. The patterned pixel electrode layer 49 serves as pixel electrodes for the TFT array.

Figure 5:
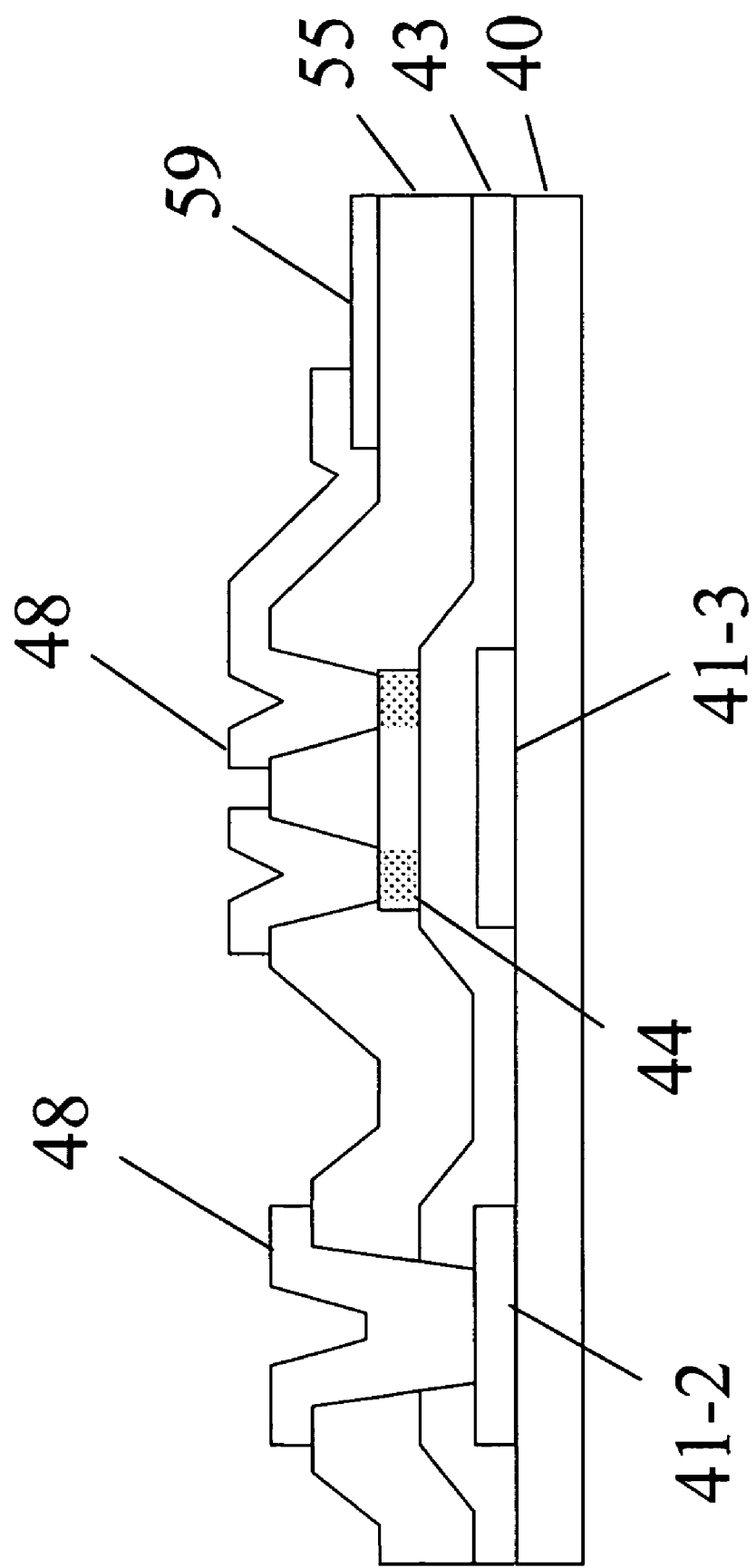
FIG. 5 is a cross-sectional diagram illustrating a method for manufacturing a TFT array in accordance with a fifth embodiment of the present invention.

FIG. 5 is a cross-sectional diagram illustrating a method for manufacturing a TFT array in accordance with a fifth embodiment of the present invention. Referring to FIG. 5, also referring to FIGS. 4A to 4E, a first mask is used to define the patterned first metal layer 41. Next, a layer of insulating material 43 is formed over the patterned silicon layer 44. A second mask is used to defined the patterned silicon layer 44. A passivation layer 55 is formed over the patterned silicon layer 44 and insulating material 43. A patterned pixel electrode layer 59 such as an ITO film is formed on the passivation layer 55 by a conventional PVD process followed by a conventional patterning and etching process, using a third mask, which serves as pixel electrodes for the TFT array. Then, the passivation layer 55 is patterned by performing a conventional patterning and etching process, using a fourth mask, exposing portions of the patterned silicon layer 44 and portions of the patterned first metal layer 41-1 and 41-2. Next, the patterned silicon layer 44 is doped with n-type or p-type impurity by a conventional implantation process, using the same fourth mask. Subsequently, the patterned second metal layer 48 is formed over the patterned conductive layer 59 and the patterned passivation layer 55, using a fifth mask.

Alternatively, referring to FIG. 5 and also FIGS. 4A to 4E, first, second and third masks are used to define the patterned first metal layer 41, the patterned silicon layer 44 and the patterned passivation layer 55, respectively. Next, the patterned silicon layer 44 is doped with n-type or p-type impurity by a conventional implanting process, using the same third mask. The patterned pixel electrode layer 59 is formed over the patterned passivation layer 55 by forming a layer of conductive material such as ITO by a conventional PVD process followed by a conventional patterning and etching process, using a fourth mask. Subsequently, the patterned second metal layer 48 is formed over the patterned pixel electrode layer 59 and the patterned passivation layer 55, using a fifth mask.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

What is claimed is:

1. A method for manufacturing a thin film transistor ("TFT") array, comprising:
   providing a substrate;
   forming a patterned first metal layer on the substrate, the patterned first metal layer including
      a plurality of first conductive lines,
      a plurality of second conductive lines disposed orthogonal to the first conductive lines, and
      a plurality of gate electrodes, each of the gate electrodes being disposed near an intersection of one of the first conductive lines and one of the second conductive lines and electrically connected to the first conductive line;
   forming an insulating layer over the patterned first metal layer;
   forming a patterned silicon layer;
   forming a patterned passivation layer over the patterned silicon layer and the patterned first metal layer, exposing portions of the patterned silicon layer and a portion of each one of the first conductive lines, each one of the second conductive lines, and each one of the gate electrodes; and
   forming a patterned doped silicon layer and a patterned second metal layer over the patterned passivation layer, filling the exposed portions of the patterned silicon layer and the exposed portions of the first conductive lines, the second conductive lines, and the gate electrodes, the patterned second metal layer including a plurality of third conductive lines and a plurality of fourth conductive lines, each of which corresponding respectively to one of the plurality of first conductive lines and one of the plurality of second conductive lines;
   wherein the first conductive lines are electrically connected to the corresponding third conductive lines through the exposed portions of the first conductive lines; and
   the third conductive lines form branch lines of a first plurality of dual-layer lines;
   wherein the second conductive lines are electrically connected to the corresponding fourth conductive lines through the exposed portions of the second conductive lines; and
   the fourth conductive lines form branch lines of a second plurality of dual-layer lines.

2. The method of claim 1, further comprising forming a patterned pixel electrode layer over the patterned second metal layer and the patterned passivation layer.

3. The method of claim 1, further comprising:
   forming a passivation layer over the patterned silicon layer;
   forming a patterned pixel electrode layer over the passivation layer; and
   patterning the passivation layer, exposing portions of the patterned silicon layer and portions of the first conductive lines or second conductive lines.

4. The method of claim 1, further comprising:
   forming a patterned pixel electrode layer over the patterned passivation layer; and
   forming a patterned doped silicon layer and a patterned second metal layer over the patterned passivation layer and the patterned pixel electrode layer, filling the exposed portions of patterned doped silicon layer and the exposed portions of the first conductive lines or second conductive lines.

5. The method of claim 1, further comprising forming trenches in the passivation layer and the insulating layer over at least one of the first conductive lines and second conductive lines of the patterned first metal layer.

6. The method of claim 5, further comprising electrically connecting the patterned first metal layer and the patterned second metal layer through the trenches.

7. The method of claim 1, further comprising forming a plurality of contact holes in the passivation layer and the insulating layer over at least one of the first conductive lines and second conductive lines of the patterned first metal layer.

8. The method of claim 7, further comprising electrically connecting the patterned first metal layer and the patterned second metal layer through the plurality of contact holes.

9. The method of claim 1, wherein each of the second conductive lines of the patterned first metal layer includes a plurality of branch lines separated from each other.

10. The method of claim 9, wherein the ratio of the length of each of the branch lines to the distance between the each branch line and its immediately adjacent branch line disposed on the same second conductive line ranges from approximately 2 to 20.

11. The method of claim 1, wherein each of the third conductive lines of the patterned second metal layer includes a plurality of branch lines separated from each other.

12. The method of claim 11, wherein the ratio of the length of each of the branch lines to the distance between the each branch line and its immediately adjacent branch line disposed on the same third conductive line ranges from approximately 2 to 20.

13. The method of claim 1, further comprising forming a patterned silicon layer including one of an amorphous silicon layer or a polycrystalline silicon layer.

14. A method for manufacturing a thin film transistor ("TFT") array, comprising:
providing a substrate;
forming a patterned first metal layer on the substrate, the patterned first metal layer including
a plurality of first conductive lines,
a plurality of second conductive lines disposed orthogonal to the first conductive lines, and
a plurality of gate electrodes, each of the gate electrodes being disposed near an intersection of one of the first conductive lines and one of the second conductive lines and electrically connected to the first conductive line;
forming an insulating layer over the patterned first metal layer;
forming a patterned silicon layer;
forming a patterned passivation layer over the patterned silicon layer and the patterned first metal layer, exposing portions of the patterned silicon layer and portions of each of the first conductive lines, each of the second conductive lines, and each of the gate electrodes;
doping impurity into the exposed portions of the patterned silicon layer; and
forming a patterned second metal layer over the patterned passivation layer, filling the exposed portions of patterned silicon layer and the exposed portions of the first conductive lines, second conductive lines, and the gate electrodes, the patterned second metal layer including a plurality of third conductive lines and a plurality of fourth conductive lines, each of which corresponds respectively to one of the plurality of first conductive lines and one of the plurality of second conductive lines of the patterned first metal layer;
wherein the first conductive lines are electrically connected to the corresponding third conductive lines through the exposed portions of the first conductive lines; and
the third conductive lines form branch lines of a first plurality of dual-layer lines;
wherein the second conductive lines are electrically connected to the corresponding fourth conductive lines through the exposed portions of the second conductive lines; and
the fourth conductive lines form branch lines of a second plurality of dual-layer lines.

15. The method of claim 14, further comprising forming a patterned pixel electrode layer over the patterned second metal layer and the patterned passivation layer.

16. The method of claim 14, further comprising:
forming a passivation layer over the patterned silicon layer;
forming a patterned pixel electrode layer over the passivation layer; and
patterning the passivation layer, exposing portions of the patterned silicon layer and portions of the first conductive lines or second conductive lines.

17. The method of claim 14, further comprising:
doping impurity into the exposed portions of the patterned silicon layer;
forming a patterned pixel electrode layer over the patterned passivation layer; and
forming a patterned second metal layer over the patterned passivation layer and the patterned pixel electrode layer, filling the exposed portions of patterned silicon layer and the exposed portions of the first conductive lines or second conductive lines.

18. The method of claim 14, further comprising forming trenches in the passivation layer and the insulating layer over at least one of the first conductive lines or second conductive lines of the patterned first metal layer.

19. The method of claim 18, further comprising electrically connecting the patterned first metal layer and the patterned second metal layer through the trenches.

20. The method of claim 14, further comprising forming a plurality of contact holes in the passivation layer and the insulating layer over at least one of the first conductive lines and the second conductive lines of the patterned first metal layer.

21. The method of claim 20, further comprising electrically connecting the patterned first metal layer and the patterned second metal layer through the plurality of contact holes.

22. The method of claim 14, wherein each of the second conductive lines of the patterned first metal layer includes a plurality of branch lines separated from each other.

23. The method of claim 22, wherein the ratio of the length of each of the branch lines to the distance between the each branch line and its immediately adjacent branch line disposed on the same second conductive line ranges from approximately 2 to 20.

24. The method of claim 14, wherein each of the third conductive lines of the patterned second metal layer includes a plurality of branch lines separated from each other.

25. The method of claim 24, wherein the ratio of the length of each of the branch lines to the distance between the each branch line and its immediately adjacent branch line disposed on the same first conductive line ranges from approximately 2 to 20.

26. The method of claim 14, further comprising forming a patterned silicon layer including one of an amorphous silicon layer or a polycrystalline silicon layer.

27. A method for manufacturing a thin film transistor ("TFT") array, comprising:
   providing a substrate;
   forming a patterned first metal layer on the substrate, the patterned first metal layer including
      a plurality of first conductive lines and
      a plurality of second conductive lines disposed orthogonal to the first conductive lines, each of the second conductive lines including
         a plurality of branch lines separated from each other;
   forming an insulating layer over the patterned first metal layer;
   forming a patterned silicon layer over the insulating layer;
   exposing portions of each of the first conductive lines and the branch lines of each of the second conductive lines of the patterned first metal layer;
   forming a patterned second metal layer over the patterned silicon layer, filling the exposed portions of each of the first conductive lines and the exposed branch lines of each of the second conductive lines, the patterned second metal layer including a plurality of third conductive lines and a plurality of fourth conductive lines, each of which corresponding respectively to one of the plurality of first conductive lines and one of the plurality of second conductive lines of the patterned first metal layer;
   wherein the first conductive lines are electrically connected to the corresponding third conductive lines through the exposed portions of the first conductive lines; and
   the third conductive lines form branch lines of a first plurality of dual-layer lines;
   wherein the branch lines of the second conductive lines are electrically connected to the corresponding fourth conductive lines through the exposed portions of the branch lines of the second conductive lines; and
   the fourth conductive lines form branch lines of a plurality of multi-layer lines.

28. The method of claim 27, wherein each of the third conductive lines of the patterned second metal layer includes a plurality of branch lines separated from each other.

29. The method of claim 28, wherein the ratio of the length of each of the branch lines to the distance between the each branch line and its immediately adjacent branch line disposed on the same third conductive line of the patterned first metal layer ranges from approximately 2 to 20.

30. The method of claim 27, wherein the ratio of the length of each of the branch lines to the distance between the each branch line and its immediately adjacent branch line disposed on the same fourth conductive line of the patterned second metal layer ranges from approximately 2 to 20.

* * * * *

UNITED STATES PATENT AND TRADEMARK OFFICE
CERTIFICATE OF CORRECTION

PATENT NO. : 7,638,371 B2  Page 1 of 1
APPLICATION NO. : 11/369624
DATED : December 29, 2009
INVENTOR(S) : Chen et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 425 days.

Signed and Sealed this

Ninth Day of November, 2010

David J. Kappos
*Director of the United States Patent and Trademark Office*